United States Patent

Elderstig et al.

[11] Patent Number: 5,984,534
[45] Date of Patent: Nov. 16, 1999

[54] METHOD AND DEVICE FOR WAVEGUIDE CONNECTION

[75] Inventors: Håkan Elderstig, Bromma; Olle Larsson, Stockholm; Göran Palmskog; Ove Öhman, both of Uppsala, all of Sweden

[73] Assignee: Telefonaktiebolaget LM Ericsson, Stockholm, Sweden

[21] Appl. No.: 08/823,388

[22] Filed: Mar. 24, 1997

[30] Foreign Application Priority Data

Mar. 25, 1996 [SE] Sweden .................................. 9601137

[51] Int. Cl.$^6$ ....................................................... G02B 6/36
[52] U.S. Cl. ................................................ 385/90; 385/88
[58] Field of Search .................................. 385/90, 89, 88, 385/91, 83, 65

[56] References Cited

U.S. PATENT DOCUMENTS

| | | | |
|---|---|---|---|
| 4,611,884 | 9/1986 | Roberts ..................................... | 385/92 |
| 4,897,711 | 1/1990 | Blonder et al. ............................ | 357/74 |
| 5,748,822 | 5/1998 | Miura et al. ............................... | 385/90 |
| 5,853,626 | 12/1998 | Kato ......................................... | 385/89 |

FOREIGN PATENT DOCUMENTS

WO93/21550  10/1993  WIPO.
WO94/28449  12/1994  WIPO.

OTHER PUBLICATIONS

International–Type Search Report re SE 96/01223 Date of mailing of Search Report: Dec. 11, 1996.
R. Klein et al., "Silicon Micromachining for Micro–Replication Technologies", *Electronics Letters*. vol. 30, No. 20, pp. 1672–1674 (Sep. 1994).

*Primary Examiner*—Rodney Bovernick
*Assistant Examiner*—Ellen E. Kang
*Attorney, Agent, or Firm*—Burns, Doane, Swecker & Mathis, L.L.P.

[57] ABSTRACT

Replicated polymeric microstructures have been used in the fabrication of optofiber waveguide connections, with the intention of simplifying the production of such connections, and therewith greatly reduce manufacturing costs. Fabrication is commenced from a silicon chip in which there has been etched grooves whose cross-sectional shape has been adapted to accommodate waveguides, such as optofibers. Firstly, the silicon chip is replicated, by plating the silicon chip with nickel for instance. The replication then serves as a model for producing a plastic copy of the silicon chip. This method of manufacture is able to produce waveguide accommodating grooves (2), such as optofiber accommodating grooves, to a very high degree of accuracy. Furthermore, the method provides a high degree of freedom in the configuration of the grooves, and also enables branched grooves for receiving branched fibres to be produced. The waveguide connection can then be used with a waveguide, such as an optofiber, together with a light transmitter or light receiver.

3 Claims, 3 Drawing Sheets

METHOD AND DEVICE FOR WAVEGUIDE CONNECTION

FIELD OF INVENTION

The present invention relates to a method of providing at least one waveguide connection, and to a device for connecting at least one waveguide to an optical transmitter or to an optical receiver, for instance.

BACKGROUND OF THE INVENTION

Known in the art are various types of waveguide connections that have been fabricated with etched silicon chips as substrate/carrier. Silicon chips, however, are expensive to produce, particularly large silicon chips, wherewith a silicon chip will preferably not be larger than 2×2 mm. Silicon chips are liable to break under the high pressures to which they subjected when pressing waveguide connections, besides being easily worn. Other types of waveguide connections include laboratory produced connections. These waveguide connections are also expensive to produce with the precision required. In order to enable fibreoptic connectors to be used on a large scale, said connectors must be able to compete strongly with existing solutions, especially with regard to cost.

SUMMARY OF THE INVENTION

Replicated polymeric microstructures have been used in the fabrication of said waveguide connections, with the intention of simplifying the production of such connections, for instance optofibre connections, and therewith greatly reduce manufacturing costs. Fabrication is commenced from a silicon chip in which there has been etched grooves whose cross-sectional shape has been adapted to accommodate waveguides, such as optofibres. Firstly, the silicon chip is replicated, by plating the silicon chip with nickel for instance. The replication then serves as a model for producing a plastic copy of the silicon chip. This method of manufacture is able to produce waveguide accommodating grooves, such as optofibre accommodating grooves, to a very high degree of accuracy. Furthermore, the method provides a high degree of freedom in the configuration of the grooves, and also enables branched grooves for receiving branched fibres to be produced. The waveguide connection can then be used with a waveguide, such as an optofibre, together with a light transmitter or light receiver.

DETAILED DESCRIPTION OF EMBODIMENTS

With the intention of illustrating the special features of the invention, there will first be described a method of manufacture of an inventive fibre optic receiver module, where the actual carrier can be produced with high precision from a plastic material and with an alignment structure useful with MM/SM-splicing of optofibres. Low cost optical components can be produced from plastic materials with the aid of replication. Practically all configurations that are possible to produce technically on silicon can be replicated on plastic material. Since replication is not in itself an expensive process, there is available an economic leeway which will enable the use of advanced manufacturing equipment, process equipment and test equipment in tool manufacture, for instance micromechanics in silicon, spark machining, LIGA techniques, electron beam lithography, and so on.

In this context, components replicated in polymeric material can be used as carriers for semiconductor components, such as detectors, and for positioning optical fibres. Replication in polymeric material is a low cost technique that can achieve great significance in packaging structures and encapsulation with concentration on "Data Comm" for instance.

Distinct from silicon, plastic has good dielectric properties. The plastic may be transparent, which can be beneficial in the case of integrated optical applications. Plastic is cheaper to use than silicon. Good optical, electrical and mechanical properties can also be combined when replicating the aforesaid components.

Figure 1:
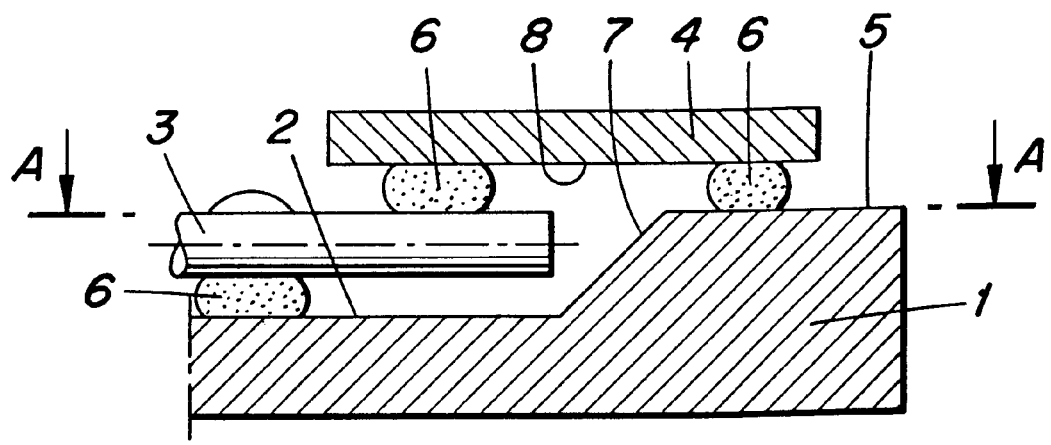
FIG. 1 is a simplified cross-sectional view taken from one side of an inventive waveguide connector with an optofibre.
Figure 2:
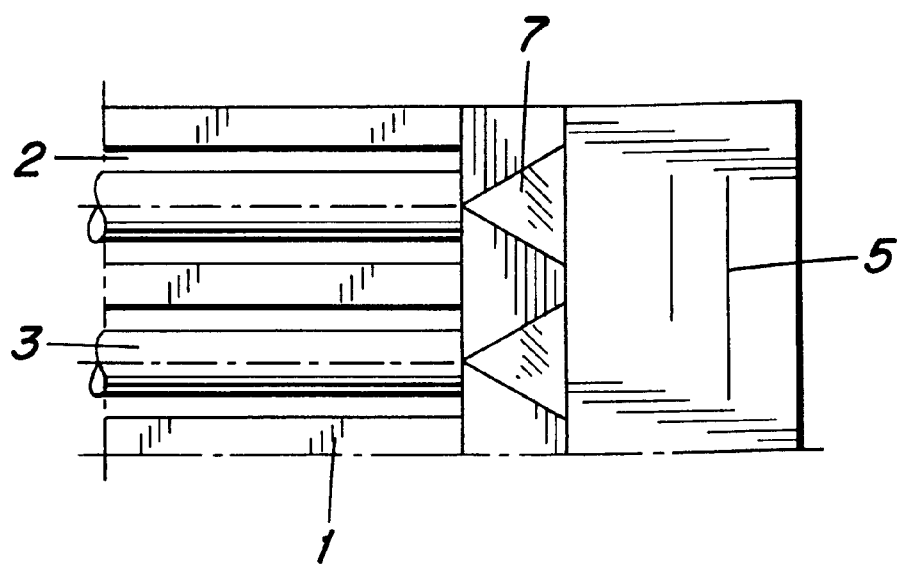
FIG. 2 illustrates from above the manner in which grooves and optofibres can be disposed in an inventive waveguide connector.

Replicated polymeric substrates 1 can be used in the construction of fibre optic transmitter/receiver modules having an alignment structure such as fibre aligning grooves 2, optofibres 3 and semiconductor components 4, such as PIN diodes, LEDs, lasers, VCSELs, amplifiers, drive electronics, integrated circuits, memories, and so on; see FIGS. 1 and 2. The polymeric substrate may form an optical backplane that includes internal and external fibre connections. The substrate may also have deposited thereon an oxide, a nitride or some other appropriate material that will protect the plastic against the effect of chemicals. The substrate may also include electric conductors 5, which may be comprised of patterned or embossed metal, for chip connection for instance. The optofibres 3 intended for the transmission of light between different connections and said components may be glued firmly to the substrate 1 with an electrically conductive glue 6, for instance. Alternatively, the components may be fastened to the substrate with the aid of a eutectic Pb/Sn, for instance. Light can be arranged to be reflected onto a detector surface 8 from a mirror 7 provided at the end of a fibre alignment groove 8, said mirror being obtained by metalizing the surface of the substrate 1 for instance, or to be reflected from a surface emitting component into the fibre. The mirror 7 will preferably slope at an angle of 45° to the substrate surface. Transmitter and receiver components may also be arranged in arrays, such as a row of eight such components on one and the same unit. The grooves are conveniently spaced at a pitch of 0.250 mm for instance, so as to prevent interaction between fibres in respective fibre alignment grooves.

Figure 3A:
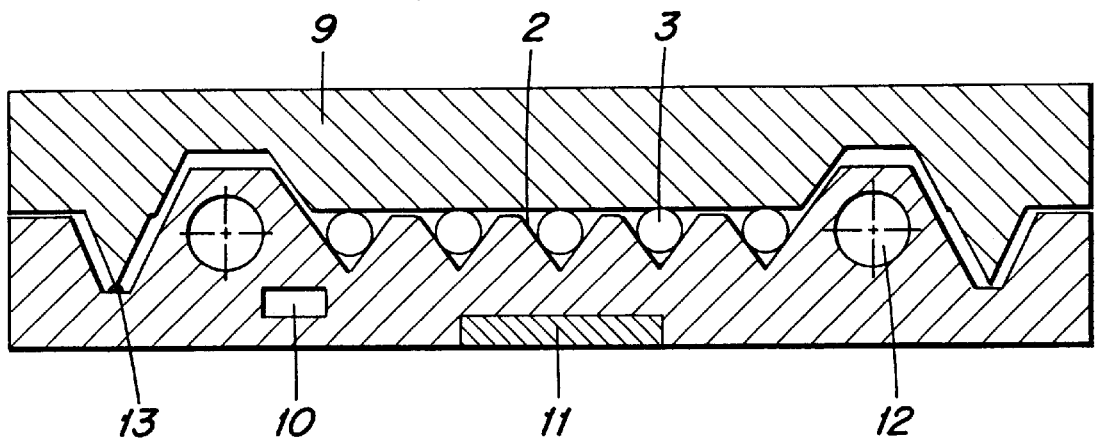
FIGS. 3A and B are simplified cross-sectional views of a coupling means for waveguide connections having a cover member that includes different groove configurations in accordance with the invention.

The active components, such as splicing/coupling means, may be protected by a polymeric material, a silicon elastomer, or may be protected by a glued-on or welded cover member 9 that affords space for or includes cavities for accommodating the components. In addition to its protective function, the cover member of a coupling means as illustrated in cross-section in FIGS. 3A and B will also function to fixate and hold the fibres 3 firmly on the substrate 1. The substrate 1 may include at least one passageway 10 through which coolant can circulate to cool hot electronic chips. The substrate may also include a recess or a hole 11 that is filled with plated metal to improve cooling. The substrate may also include guide-pin receiving holes 12 for connection to an MT device.

The cover member 9 of the waveguide connection may be fastened to the substrate 1 by ultrasonic welding 13 or may be glued firmly thereto either before or after inserting and aligning the optofibres. The glue used will preferably have a refractive index that matches the refractive index of other equipment.

When manufacturing a waveguide connection with the aid of masks, a V-groove alignment structure is first etched in a silicon chip, for instance by wet etching in 70° KOH, wherewith the geometry of the V-grooves has been adapted to match a received waveguide, such as an optofibre. A copy of the structured silicon chip is then created by electroplating, with nickel for instance, wherein the resultant nickel replicate is then used as a mould in the following injection moulding and heat embossment of a plastic material, such as polycarbonate (PC) or polymethyl methacrylate (PMMA), for instance. The resultant hot-embossed substrate will have the same configuration as the original silicon chip. It has been possible to replicate polycarbonate substrates with a diameter of 80 mm from silicon-etched microstructures with good replication and with cycle times of less than twenty seconds.

The surface of the polycarbonate was then metalized by sputtering with TiW and Au to a respective thickness of 500 Å with respect to TiW and of 2000 Å with respect to Au. The metals are able to function both as an electric conductor, a cooler, and as a mirror. Two separate contacts can be created on each chip, by sawing a shallow groove in the polycarbonate/chip.

Optical multimode fibres 3 comprised of quartz are then glued firmly 6 into the V-grooves 2 provided in the chip, such that the ends of the fibres lie in front of the sloping mirror, said mirror being able to reflect light from the fibre up onto a component surface.

Alternatively, microprocessed silicon substrates may be used as inserts directly in an injection moulding press, with the advantage of obtaining a short manufacturing chain. However, cracked silicon moulds are liable to create a problem in the case of this latter alternative, and it is often difficult to trim-in the system, resulting in incomplete replication, among other things. However, the greatest drawback is that in order for the silicon structure to function as a mould, the structure must consist of the negative of the article to be injection-moulded, which creates process/technical difficulties and/or constructional limitations.

The method of producing waveguide connections in accordance with the invention has certain similarities with the manufacture of compact discs, wherein a disc can be injection-moulded in less than five seconds and can contain information in the form of shallow pits of less than one micrometer in depth. It has been found in earlier trials that deep V-grooves are liable to crack silicon chips that have a standard thickness of 500 μm. A further conceivable modification is to shield the lithographic pattern in the periphery of a silicon carrier. In the absence of such a shield, high punctiform loads may be created as the plastic is extruded from the mould via the microstructure. On the other hand, when injection-moulding polymeric substrates using silicon carriers as a mould, conventional injection-moulding presses or compact disc (CD) manufacturing injection-moulding presses can be used.

Figure 3B:
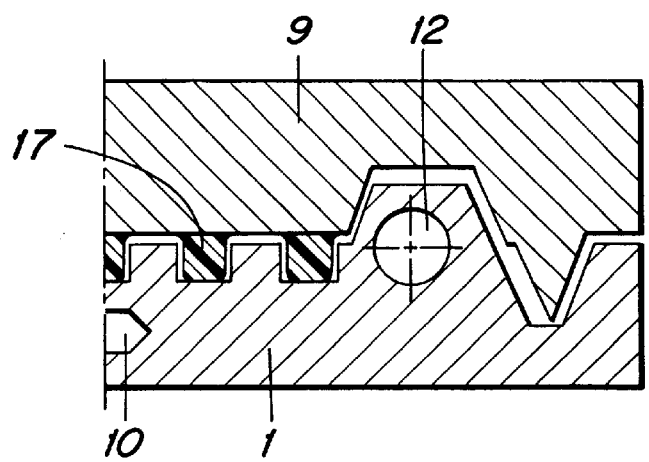

Alternatively, instead of placing optofibres, branched or straight, in the grooves provided in the substrate, an appropriate plastic material 17 may be placed between the substrate 1 and the cover member 9, as shown in FIG. 3B. When pressing the cover member against the substrate, this plastic material would essentially fill-out the grooves in the substrate, said grooves having a V-shape or any other suitable shape. It is possible that some of the light-conducting plastic will be deposited between the planar surfaces of the substrate and the cover member by this pressing operation, although an effective light conducting function will be ensured provided that the major part of the light conducting plastic material 17 is deposited in the waveguide grooves.

Figure 4:
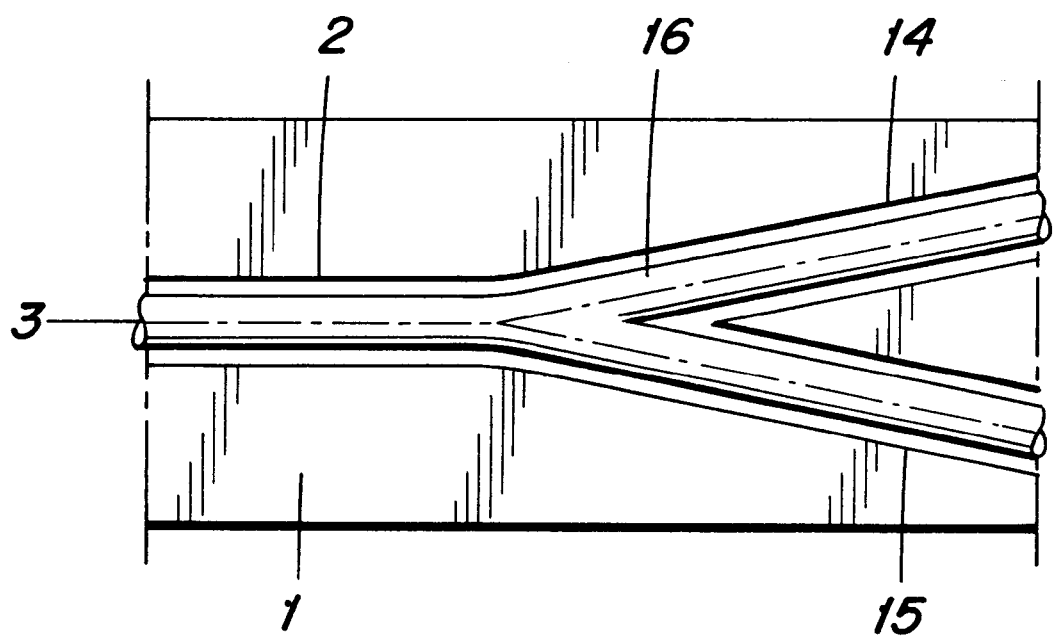
FIG. 4 illustrates a branching pattern for a waveguide connection in accordance with the invention.

FIG. 4 illustrates part of a substrate 1 having a groove 2 that branches into two grooves 14 and 15, which may be appropriate in some cases, wherein the different parts of the divided plastic or the branched optofibre 16 may be adapted to transmit light energy to or from a receiver or transmitter through the medium of a mirror.

What is claimed:

1. A device for connecting at least one waveguide to one of an optical transmitter and an optical receiver, said device comprising an alignment structure having a pattern of grooves for accommodating a branched waveguide, wherein the alignment structure further comprises at least one cooling means and a means for transmitting light between the waveguide and said one of the optical transmitter and the optical receiver such as to connect at least one of the optical transmitter and the optical receiver to the device and to said waveguide present in the alignment structure.

2. A device according to claim 1 wherein said cooling means is a cooling circulating passageway.

3. A device according to claim 1 wherein said cooling means is a metal-filled recess.

* * * * *